United States Patent
Smith

(10) Patent No.: US 6,221,776 B1
(45) Date of Patent: Apr. 24, 2001

(54) ANTI-REFLECTIVE COATING USED AS A DISPOSABLE ETCH STOP

(75) Inventor: Eugene C. Smith, Apple Valley, MN (US)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 09/073,033

(22) Filed: May 5, 1998

(51) Int. Cl.[7] ........................................... H01L 21/00
(52) U.S. Cl. ..................... 438/692; 148/33.5; 257/435; 257/436; 257/437; 438/719; 438/723; 438/724; 438/740
(58) Field of Search ........................ 438/692, 719, 438/723, 724, 740, 743, 744; 216/38, 67, 79, 88; 148/33.2, 33.4, 33.5; 257/435, 436, 437

(56) References Cited

U.S. PATENT DOCUMENTS 5,976,769 * 11/1999 Chapman .................. 438/734 X
5,998,300 * 12/1999 Tabara .................... 438/740 X

* cited by examiner

*Primary Examiner*—William Powell
(74) *Attorney, Agent, or Firm*—Kevin L. Daffer; Conley, Rose & Tayon

(57) ABSTRACT

The present invention advantageously provides a method and apparatus in which a sacrificial anti-reflective coating is used as an etch stop layer to protect a material from being etched. The anti-reflective coating has a relatively high viscosity which allows it to pool in recess regions as it is spin-on deposited across a surface having elevational disparities. This feature of the anti-reflective coating may be taken advantage of when using the anti-reflective coating as an etch stop layer. That is, the anti-reflective coating may be spin-on deposited across a substrate and structures arranged upon the substrate to allow the anti-reflective coating to accumulate in the recess regions interposed between the structures. In this manner, a thicker layer of the anti-reflective coating is formed in the recessed region above the substrate than above the structures which comprises a first layer of material arranged upon a second layer of material. Thus, an etch chemistry which exhibits a relatively high selectivity ratio of the first layer of material relative to the anti-reflective coating may be used to etch the relatively thin layer of the anti-reflective coating and the first layer of material from above the second layer of material. Although the relatively thick layer of anti-reflective coating also undergoes etching, the etch rate of the coating is not fast enough to remove its entire thickness before the first layer of material is completely etched.

21 Claims, 3 Drawing Sheets

ANTI-REFLECTIVE COATING USED AS A DISPOSABLE ETCH STOP

BACKGROUND OF THE INVENTION

1. Field of the Invention

This invention relates to integrated circuit manufacturing and, more particularly, to a method and system in which a sacrificial anti-reflective coating is used to protect an underlying, lower elevation silicon-based material from being etched while removing an underlying higher elevation silicon-based material.

2. Description of the Related Art

Fabrication of a multi-level integrated circuit involves numerous processing steps. After impurity regions have been formed within a semiconductor substrate and gate areas defined upon the substrate, interconnect routing is placed across the semiconductor topography and connected to the impurity regions. An interlevel dielectric is formed between the interconnect routing and the substrate to isolate the two levels. Contact areas are placed through the dielectric to electrically link the interconnect routing to select impurity regions extending across the substrate. A second level of interconnect routing may be placed across a second level of interlevel dielectric arranged above the first level of interconnect routing. The first and second levels of interconnect routing may be coupled together by contact structures arranged through the second level of interlevel dielectric. Additional levels of interconnect routing and interlevel dielectric may be formed, if desired.

Patterning the various structures of an integrated circuit involves selectively removing portions of one material while other materials are maintained intact. Wet etch techniques typically demonstrate a high selectively for one material relative to other materials. Wet etch techniques, however, are generally isotropic. That is, wet etching occurs at the same rate in all directions. Therefore, if the thickness of a material being etched is comparable to the minimum pattern dimension, isotropic etching can cause undercutting into the critical dimension. Thus, the size and shape of an etched feature defined using an isotropic etch may be altered from their design specifications. For example, the slope of the sidewalls of the etched feature is often not formed to the desired specific angle. In order to preserve profile integrity, wet etching has given way to a "dry", anisotropic etch technique which occurs at a faster rate in a vertical direction than in a horizontal direction.

Dry etching offers an important manufacturing advantage of eliminating the handling, consumption, and disposal of relatively large quantities of dangerous acids and solvents typically used to wet etch various thin films. More importantly, dry etching is better suited for maintaining the critical profile of a structure, particularly as minimum pattern dimensions continue to shrink. One drawback of the dry etch technique, however, is that it may be difficult to achieve a high selectivity of one silicon-based material relative to other silicon-based materials. For example, a high etch selectivity of silicon nitride ($Si_3N_4$) relative to both silicon dioxide ($SiO_2$) and silicon is particularly difficult to accomplish using a dry etch process. Unfortunately, it may be necessary to etch select portions of a silicon nitride ("nitride") layer from a doped polycrystalline silicon ("polysilicon") layer arranged above a silicon-based substrate in which field isolation regions comprising silicon dioxide ("oxide") are formed. The polysilicon layer may be patterned to form various structures, e.g., a gate conductor of a MOS transistor employed by, e.g., an SRAM memory cell. The nitride layer may be formed across the polysilicon layer to electrically isolate particular polysilicon structures from conductive structures, e.g., contacts, which may be subsequently formed adjacent to those polysilicon structures.

It may be necessary to remove the nitride layer from certain polysilicon structures to permit contacts to be purposefully formed in electrical communication with those polysilicon structures. Unfortunately, because of the time demand and cost required to develop a dry etch chemistry and machine for achieving a high selectivity of nitride with respect to silicon and oxide, no adequate dry etch process has been currently developed. Absent a dry etch technique which exhibits a high selectivity of nitride to both silicon and oxide, the silicon-based substrate and the field oxide might be unintentionally etched while anisotropically etching the nitride layer. Consequently, dangling bonds and an irregular grain structure may result in the upper surfaces of the silicon-based substrate and the field oxide. It is believed that an irregular grain structure provides migration avenues through which foreign species can pass into active areas of the substrate and into the field isolation regions. Further, the dangling bonds may promote the trapping of those foreign species in the active areas and the field isolation regions. The presence of those foreign species might lead to various problems, such as increased current leakage between active areas.

It would therefore be of benefit to develop a method for exclusively etching one material without undesirably etching other materials using a dry etch process. Otherwise, the integrated circuit structures which employ those materials might suffer damage as a result of being etched. Although developing a new dry etch chemistry which is highly selective to a particular material relative to other materials would be useful, doing so would be too costly and time consuming. Therefore, it would be more desirable to form a barrier between the etch chemistry and those materials which do not require removal. Such a barrier would prevent the materials from being exposed to the etch gases, allowing the materials to remain intact during the etching of another material.

SUMMARY OF THE INVENTION

The problems outlined above are in large part solved by the technique hereof in which a acrificial anti-reflective coating is used to protect a material from being etched. An "anti-reflective coating" is a polymer film which is highly absorbing and non-bleaching at the wavelength of light used to expose photoresist during optical lithography. The anti-reflective coating is "sacrificial" in that it is temporarily placed upon a semiconductor topography to serve its purpose and then entirely removed. Most of the materials employed by an integrated circuit may be selectively etched without significantly etching the anti-reflective coating. As such, a relatively thick portion of the anti-reflective coating may be placed across a substrate to inhibit the substrate from being etched while removing a first material beneath a relatively thin portion of the anti-reflective coating. The anti-reflective coating provides an etch stop barrier between the etch chemistry and the substrate. The presence of the anti-reflective coating thus serves to prevent the etchants from contacting and attacking the substrate. Therefore, the etch selectivity ratio of the silicon-based substrate relative to the silicon-based first material need not be relatively high to prevent significant etching of the substrate.

Broadly speaking, one embodiment hereof suggests forming an anti-reflective coating across a substrate and selectively etching a first layer of material arranged above a portion of the substrate at a substantially faster rate than the anti-reflective coating. The substrate may include various structures composed of the same material as the first layer of material as well as materials which are dissimilar from the first layer of material, yet are silicon-based. The etch stop layer is sufficiently thick to inhibit etching of the substrate materials. The substrate may include only one level of an integrated circuit, or it may include multiple levels of an integrated circuit. The first layer of material preferably belongs to structures which are spaced laterally apart and above the substrate.

The anti-reflective coating has a relatively high viscosity which allows it to "pool" in recess regions as it is spin-on deposited across a surface having elevational disparities. This feature of the anti-reflective coating may be taken advantage of when using the anti-reflective coating as an etch stop layer. That is, the anti-reflective coating may be spin-on deposited across the substrate and the structures comprising the first layer of material to allow the anti-reflective coating to accumulate in the recess regions interposed between the structures. In this manner, a thicker layer of the anti-reflective coating is formed in the recessed region above the substrate than above the structures. Thus, an etch chemistry which exhibits a relatively high selectivity ratio of the first layer of material as compared to the anti-reflective coating may be used to etch the thin layer of the anti-reflective coating from above the first layer of material. Once exposed, the first layer of material is then etched at a fast rate. Although the thick layer of anti-reflective coating also undergoes etching, the etch rate of the coating is not fast enough to remove it in regions laterally displaced from the first layer of material before the first layer of material is completely etched.

According to an embodiment, a substrate comprises a single crystalline silicon structure containing field isolation regions arranged at spaced distances apart. The field isolation regions may, e.g., be LOCOS isolation structures. A first structure and a second structure are arranged a spaced distance apart above the substrate. The first and second structures may be laterally spaced apart by a relatively short distance of, e.g., less than 0.3 micron. Each of the first and second structures comprises a layer of nitride arranged across a layer of a conductive material, e.g., doped polysilicon. One of the structures may be arranged upon one of the field isolation regions. The other structure may be arranged upon an active area of the silicon-based structure interposed between a pair of the field isolation regions. It is to be understood that these structures may extend horizontally across the substrate to other areas of the substrate. The structures may serve as, e.g., gate conductors of transistors, word lines of a memory device, bit lines of a memory device, or local interconnects between two such devices.

An anti-reflective coating is spin-on deposited across the first and second structures and the substrate. The anti-reflective coating, which has a relatively high viscosity, may accumulate more so in the narrow space interposed between the two structures than directly above the structures. As a result, the anti-reflective coating arranged across the first and second structures is substantially thinner than the anti-reflective coating arranged across the substrate in the space between the first and second structures. The structures must exceed a pre-determined height to ensure that an adequate amount of the anti-reflective coating accumulates above the substrate to protect the substrate from being etched.

Subsequently, a photosensitive material known as "photoresist" may be spin-on deposited across the anti-reflective coating. Select regions of the photoresist are then exposed to radiation, e.g., ultraviolet light, to alter the solubility of those regions. The presence of the anti-reflective coating beneath the photoresist advantageously prevents the radiation waves propagating through the photoresist from being reflected back up through the resist by underlying materials. It is well known that standing waves in photoresist are caused by the constructive and destructive interference of reflected and incidence radiation waves. Such standing waves contribute to resolution loss and defects in the photoresist. After the exposure step of lithography, the photoresist is washed with a solvent that preferentially removes resist areas of higher solubility.

The uncovered regions of the nitride layer and the thin layer of anti-reflective coating overlying the nitride layer are then etched away using, e.g., a dry etch chemistry which exhibits a high selectivity for the nitride layer relative to the underlying conductive layer. The anti-reflective coating is also etched at a slower rate than the nitride layer. However, the etch rate of the anti-reflective coating is still sufficient to remove the thin layer of anti-reflective coating from the nitride layer. Otherwise, the nitride layer could not be removed. The time required to remove both the thin layer of anti-reflective coating and the nitride layer from the polysilicon layer is less than that required to remove the thick layer of anti-reflective coating from the substrate. Therefore, the thick layer of the anti-reflective coating above the substrate substantially inhibits etching of the substrate. Advantageously, the etch chemistry need not have a high selectivity ratio of nitride to oxide to inhibit the trench isolation structures from being etched.

BRIEF DESCRIPTION OF THE DRAWINGS

Other objects and advantages of the invention will become apparent upon reading the following detailed description and upon reference to the accompanying drawings in which.

Figure 1:
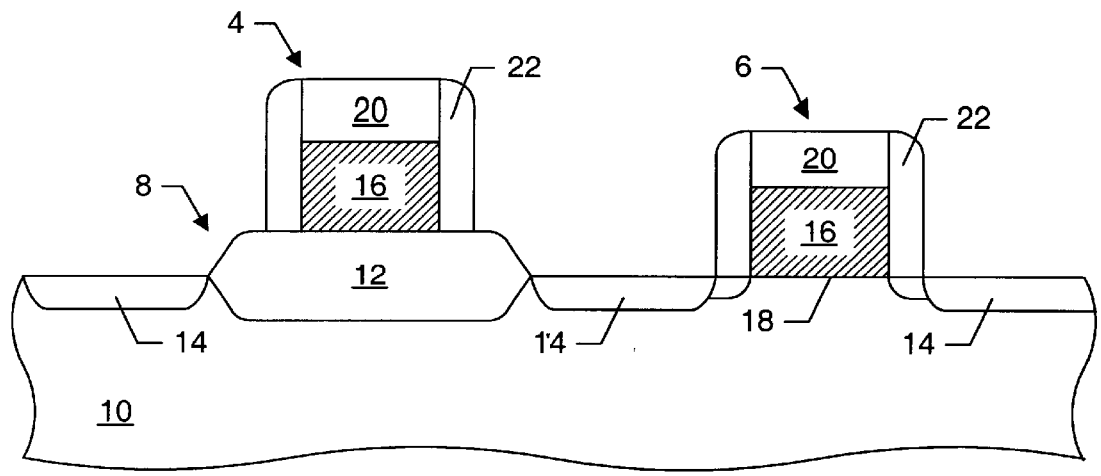
FIG. 1 is a partial cross-sectional view of a semiconductor topography, wherein a first structure and a second structure comprising a nitride layer and a conductive layer are arranged a spaced distance apart upon a substrate.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF PREFERRED EMBODIMENTS

Turning now to the drawings, FIG. 1 depicts a first structure 4 spaced laterally from a second structure 6 upon a substrate 8. According to an embodiment, substrate 8 comprises a single crystalline silicon structure 10 which has been lightly doped with p-type or n-type species. Substrate 8 also includes a field oxide region 12 which, as shown, may be a LOCOS structure. Alternately, field oxide region 12 may be in the form of a shallow trench isolation structure. Junction regions 14 comprising dopant species opposite in type to those of the bulk of silicon-based structure 10 have been implanted into silicon-based structure 10. Each of the first and second structures 4 and 6 comprise a conductive layer 16 (e.g., doped polysilicon or metal) residing beneath a nitride layer 20. Conductive layer 16 and nitride layer 20 had been previously patterned using lithography and an etch process to define the opposed sidewall surfaces of first and second structures 4 and 6. Each structure comprising conductive layer 16 may serve as various elements of an ensuing integrated circuit (e.g., a gate conductor of a transistor, word line, a bit line, or a local interconnect). Junction regions 14 may be graded junctions which decrease in concentration in a lateral direction away from the adjacent conductive layer 16.

Although first structure 4 is shown as being arranged upon field isolation region 12, the first structure may extend horizontally across the field isolation region to active areas within silicon-based structure 10. Second structure 6 is shown as being arranged upon silicon-based structure 10. A gate dielectric 18 may be interposed between structure 10 and conductive layer 16. The combination of second structure 6 and the junctions 14 adjacent second structure 6 thus forms a MOS transistor in which conductive layer 16 acts as a gate conductor. Nitride spacers 22 may also be arranged upon the opposed sidewall surfaces of first and second structures 4 and 6. Nitride spacers 22 and nitride layer 20 which encapsulate conductive layer 16 may serve to isolate the conductive material from contacts subsequently formed to silicon-based structure 10. The configuration of the structures shown in FIG. 1 may be found in, e.g., an SRAM memory device.

Figure 2:
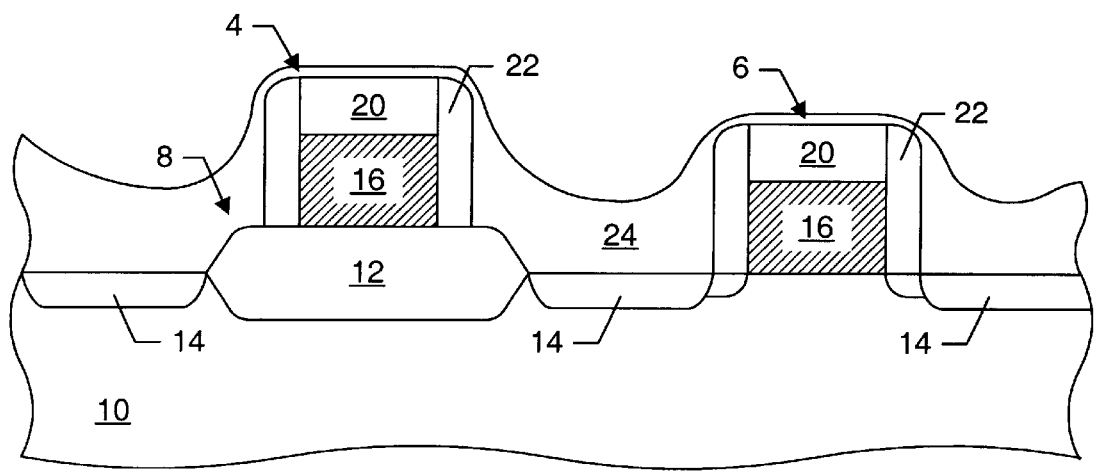
FIG. 2 is a partial cross-sectional view of a semiconductor topography, wherein an anti-reflective coating ("ARC") is spin-on deposited across the substrate such that the ARC above the first and second structures is substantially thinner than the ARC interposed between the first and second structures, subsequent to the step in FIG. 1.
Figure 3:
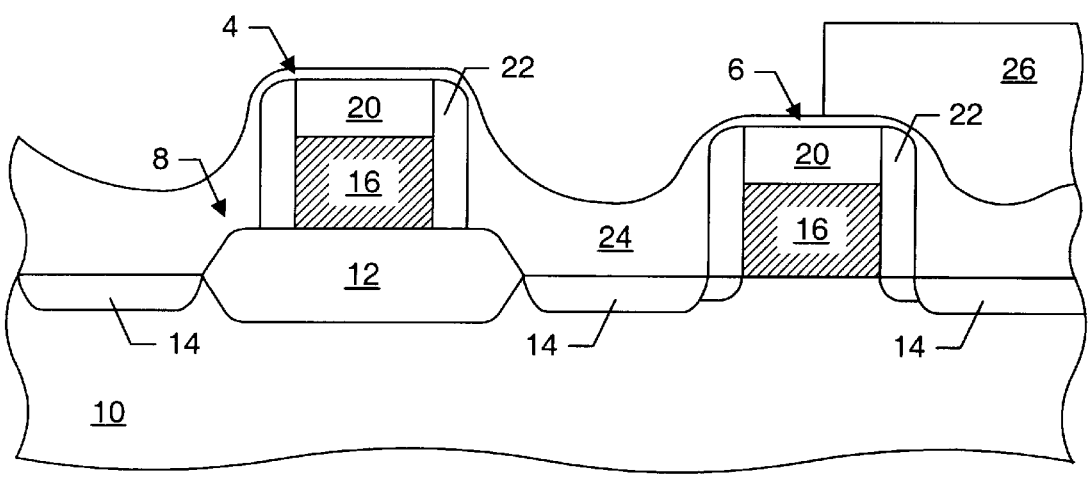
FIG. 3 is a partial cross-sectional view of a semiconductor topography, wherein a photoresist masking layer is patterned across a select portion of the ARC, subsequent to the step in FIG. 2.

FIG. 2 illustrates the formation of an anti-reflective coating 24 across substrate 8 and first and second structures 4 and 6. Various types of anti-reflective coatings used in a conventional manner are commercially available from Brewer Science Co. in Rolla, Mo. Anti-reflective coating 24 is a polymeric material which has a relatively high viscosity. Anti-reflective coating 24, according to the preferred embodiment and/or application hereof, is spin-on deposited across the topography using a standard spin-on deposition apparatus. Preferably, the combined thickness of conductive layer 16 (e.g., 2,000 Å) and nitride layer 20 (e.g., 1,800 Å) is greater than the step height of field oxide region 12 above the surface of silicon-based structure 10 (e.g., 1,000 Å) to permit pooling of anti-reflective coating 24 between first and second structures 4 and 6. Thus, as a result of the deposition, anti-reflective coating 24 is thicker in the recess region between first and second structures 4 and 6 than above first and second structures 4 and 6. As such, a thick layer of anti-reflective coating is formed above the exposed regions of substrate 8 while a thin layer of anti-reflective coating is formed above first and second structures 4 and 6. Thereafter, a photoresist masking layer 26 may be optically patterned above a portion of second structure 6, as shown in FIG. 3.

It is believed that the anti-reflective coating can be composed of materials possibly beyond polymers. Furthermore, the anti-reflective coating might be applied using, e.g., chemical vapor deposition and/or sputter techniques. Whatever the composition or the deposition technique, the outcome remains the same: to produce an anti-reflective coating which takes on a more planar surface than the topography on which it is placed. Assuming, merely as an example, that the combined thickness of layer 16 and nitride 20 is approximately 3800 to 4500 Å, and that, e.g., the spacing between structures 4 and 6 is between 0.20 to 5.0 microns, then a possible ratio of thickness of the anti-reflective coating in the space between structures 4 and 6 and the thickness above structures 4 or 6 can be approximately in the range of 3:1 to possibly 30:1. Of course, the ratio of thicknesses vary depending on the height of structures 4 and 6, the spacing between structures 4 and 6, the composition of the anti-reflective coating, and the technique used to deposit the anti-reflective coating.

Figure 4:
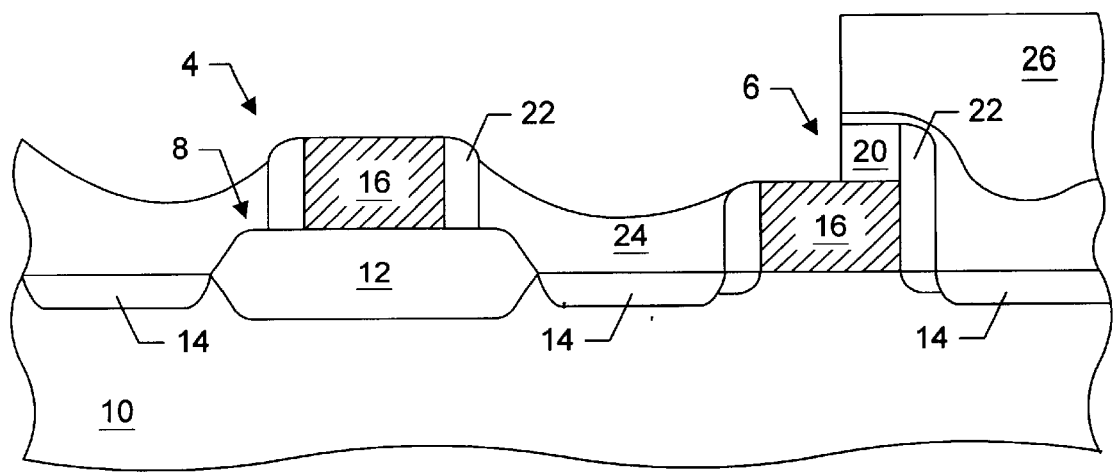
FIG. 4 is a partial cross-sectional view of a semiconductor topography, wherein regions of the thin layer of ARC and the nitride layer not covered by the photoresist are etched from the conductive material, subsequent to the step in FIG. 3.

Turning to FIG. 4, the portions of the thin layer of anti-reflective coating 24, nitride layer 20, and nitride spacers 22 not covered by photoresist 26 are then etched. Preferably, a dry etch chemistry having a relatively high selectivity ratio of nitride to the conductive material and to the anti-reflective coating is employed for the etch step. For example, a plasma comprising $CF_4$ and $O_2$ which exhibits a high selectivity for nitride relative to silicon may be used to anisotropically etch nitride layer 20 from polysilicon conductive layer 16. The etch duration is selected to terminate after the regions of nitride layer 20 not covered by photoresist 26 have been completely removed from conductive layer 16. The etch duration is preferably not long enough to etch entirely through the relatively thick layer of anti-reflective coating 24 arranged across substrate 8. In this manner, particular regions of nitride layer 20 are removed from conductive layer 16 without etching, and thus damaging, field oxide region 12 and silicon-based junctions 14.

Figure 5:
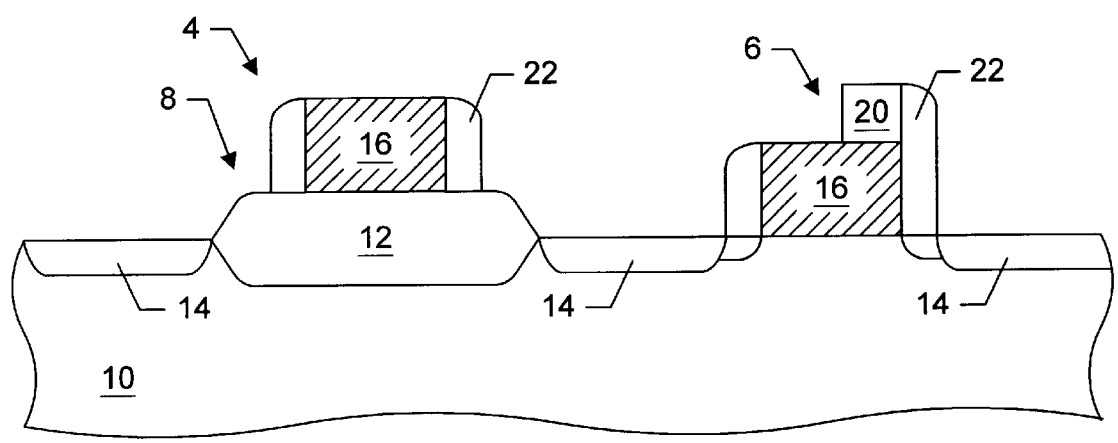
FIG. 5 is a partial cross-sectional view of a semiconductor topography, wherein the photoresist and the ARC are concurrently etched from the topography, subsequent to the step in FIG. 4.
Figure 6:
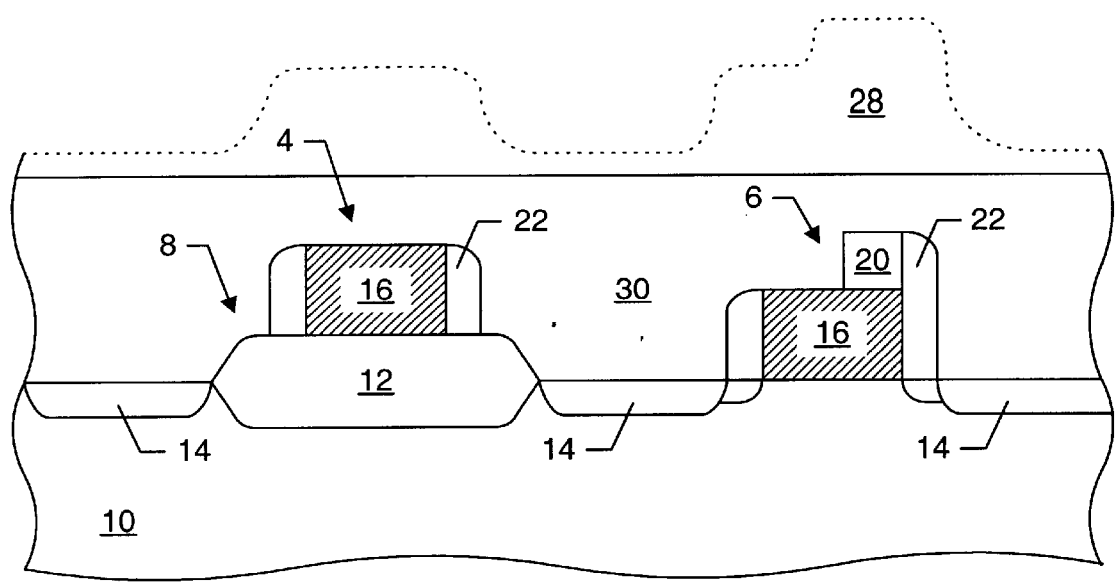
FIG. 6 is a partial cross-sectional view of a semiconductor topography, wherein an interlevel dielectric is formed across the first and second structures and the substrate, subsequent to the step in FIG. 5.
Figure 7:
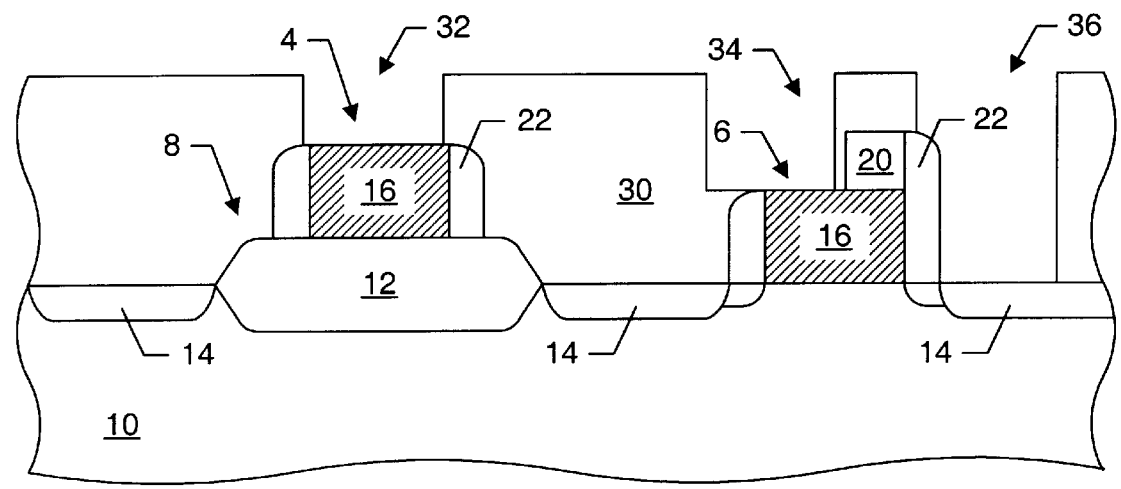
FIG. 7 is a partial cross-sectional view of a semiconductor topography, wherein openings are etched through the interlevel dielectric to the conductive layer of the first structure and to a junction arranged within a silicon-based structure adjacent the second structure, subsequent to the step in FIG. 6.

Subsequently, as depicted in FIG. 5, photoresist 26 and the retained portions of anti-reflective coating 24 are stripped from the semiconductor topography. An etch technique which is highly selective to the photoresist and the anti-reflective coating relative to nitride, oxide, and silicon is preferably used. FIG. 6 illustrates the formation of an interlevel dielectric 30 across substrate 8 and first and second structures 4 and 6. Interlevel dielectric 30 is first formed by depositing a dielectric, e.g., oxide or another glass-based material across the topography using chemical-vapor deposition. A portion 28 of the dielectric is then removed while simultaneously planarizing the surface of the dielectric using, e.g., chemical-mechanical polishing. Turning to FIG. 7, openings 32, 34, and 36 (or vias) may then be formed vertically through interlevel dielectric 30 using multiple lithography and selective etch steps chosen to terminate at different times. In this manner, opening 32 is formed to conductive material 16 of first structure 4, opening 34 is formed to conductive layer 16 of second structure 6, and opening 36 is formed to one junction 14. The presence of nitride spacer 22 and nitride layer 20 adjacent conductive material 16 of second structure 6 protects conductive material 16 from being exposed by the etching of opening 36. In subsequent processing steps, openings 32, 34, and 36 may be filled with conductive material to form contacts.

It will be appreciated to those skilled in the art having the benefit of this disclosure that this invention is believed to provide a method and system in which a sacrificial (or disposable) anti-reflective coating is used to protect a material from being etched. The anti-reflective coating is deposited such that an upper surface is more planar than the surface on which it is placed. The underlying surface or topography includes at least one silicon-based conductor (i.e., polysilicon) on which a silicon-based layer (i.e., silicon nitride) pre-exists. Features of the topography may be applicable to an SRAM circuit; however, any circuit having need for protecting certain silicon-based material while removing others fall within the spirit and scope of the present embodiments. A circuit which can accommodate thick and thin areas of an anti-reflective coating is therefore one which is particularly suited for providing dissimilar protection of underlying silicon-based structures. Further modifications and alternative embodiments of various aspects of the invention will be apparent to those skilled in the art in view of this description. The materials in the above example were only mere examples and may be substituted with other materials. It is intended that the following claims be interpreted to embrace all such modifications and changes and, accordingly, the specification and drawings are to be regarded in an illustrative rather than a restrictive sense.

What is claimed is:

1. A method for forming an integrated circuit, comprising:
    blanket depositing an anti-reflective coating upon a substrate and a first layer of material having portions selectively removed above the substrate; and
    etching through the anti-reflective coating above the first layer of material to remove an exposed portion of the first layer of material while retaining at least a portion of the anti-reflective coating above the substrate.

2. The method of claim 1, wherein said blanket depositing comprises depositing the anti-reflective coating across the substrate and the first layer of material such that a first thickness of the anti-reflective coating above the substrate is substantially greater than a second thickness of the anti-reflective coating above the first layer of material.

3. The method of claim 2, wherein said etching through the anti-reflective coating above the first layer of material removes the second thickness of the anti-reflective coating.

4. The method of claim 1, wherein a second layer of material substantially dissimilar to the first layer of material exists directly beneath the first layer of material.

5. The method of claim 4, further comprising concurrently patterning the first layer of material and the second layer of material prior to said depositing.

6. The method of claim 5, wherein the first layer of material comprises silicon nitride, the second layer of material comprises a conductive material, and the substrate comprises a field isolation structure comprising silicon dioxide arranged within an upper region of a single crystalline silicon structure.

7. The method of claim 6, wherein said concurrently patterning the first and second layers of material forms laterally spaced first and second stacks of patterned first and second layer portions, and wherein one of said stacks is configured upon the field isolation structure.

8. The method of claim 5, wherein said depositing the anti-reflective coating comprises accumulating a thicker layer of the anti-reflective coating in a lateral space between a pair of stacks of patterned first and second layer portions than directly above either of the pair of stacks.

9. The method of claim 1, wherein said etching comprises anisotropically etching the silicon nitride using a plasma comprising $CF_4$ and $O_2$.

10. The method of claim 1, further comprising patterning photoresist above select regions of the first layer of material prior to said etching.

11. The method of claim 10, wherein said etching comprises removing areas of a second layer of material exclusive of a region beneath the patterned photoresist.

12. The method of claim 11, further comprising concurrently removing the photoresist and the anti-reflective coating from the first layer of material subsequent to said etching.

13. The method of claim 12, wherein the anti-reflective coating substantially inhibits the field isolation structure and the single crystalline silicon structure from being etched.

14. An integrated circuit comprising:
    a first structure laterally spaced from a second structure above a substrate; and
    an anti-reflective coating arranged upon and interposed between the first structure and the second structure for protecting the substrate from being etched, wherein a first thickness of the anti-reflective coating arranged between the first and second structures is substantially greater than a second thickness of the anti-reflective coating upon the first and second structures.

15. The integrated circuit of claim 14, wherein each of the first and second structures comprise a first layer of material arranged across a second layer of material substantially dissimilar to the first layer of material.

16. The integrated circuit of claim 14, wherein the first layer of material comprises silicon nitride and the second layer of material comprises a conductive material.

17. The integrated circuit of claim 16, wherein the substrate comprises a first isolation region comprising silicon dioxide arranged within an upper region of a single crystalline silicon structure.

18. The integrated circuit of claim 17, wherein the first structure is elevated above an upper surface of the single crystalline silicon structure by the first isolation region.

19. The integrated circuit of claim 18, further comprising a second isolation region comprising silicon dioxide laterally spaced from the first isolation region, wherein the second structure is elevated above the upper surface of the single crystalline silicon structure by the second isolation region.

20. The integrated circuit of claim 18, wherein the second structure contacts the upper surface of the layer of single crystalline silicon.

21. The method of claim 2, wherein said blanket depositing further comprises spin-on depositing.

* * * * *